United States Patent [19]
Asai et al.

[11] Patent Number: 5,637,406
[45] Date of Patent: Jun. 10, 1997

[54] METALLIZED ALUMINUM NITRIDE SUBSTRATE

[75] Inventors: Hironori Asai; Yasuyuki Sugiura, both of Kanagawa-ken, Japan

[73] Assignee: Kabushiki Kaisha Toshiba, Kanagawa-ken, Japan

[21] Appl. No.: 855,468

[22] Filed: Mar. 23, 1992

Related U.S. Application Data

[63] Continuation of Ser. No. 501,095, Mar. 29, 1990, abandoned.

[30] Foreign Application Priority Data

Mar. 31, 1989 [JP] Japan ................................ 1-81932

[51] Int. Cl.⁶ ..................................... C04B 41/51
[52] U.S. Cl. ............... 428/469; 428/472; 428/697; 428/698; 428/699; 428/901
[58] Field of Search ..................... 428/698, 704, 428/469, 472, 697, 699, 901

[56] References Cited

U.S. PATENT DOCUMENTS

| | | | |
|---|---|---|---|
| 4,540,673 | 9/1985 | Takeda et al. | 428/698 |
| 4,591,537 | 5/1986 | Aldinger et al. | 428/901 |
| 4,659,611 | 4/1987 | Iwase et al. | 428/698 |
| 4,756,976 | 7/1988 | Komeya et al. | 428/699 |
| 4,770,953 | 9/1988 | Horiguchi et al. | 428/901 |
| 4,818,626 | 4/1989 | Werdecker et al. | 428/469 |
| 4,840,853 | 6/1989 | Iio et al. | 428/698 |
| 4,863,658 | 9/1989 | Sugiura et al. | 264/65 |

FOREIGN PATENT DOCUMENTS

| | | |
|---|---|---|
| 0276788 | 8/1988 | European Pat. Off. |
| 0285127 | 10/1988 | European Pat. Off. |
| 50-75208 | 6/1975 | Japan |
| 2176838 | 8/1987 | Japan |
| 0117093 | 5/1989 | Japan |

OTHER PUBLICATIONS

Iwase et al., "Thick Film and Direct Bond Copper Forming Technologies for Aluminum Nitride Substrate," IEEE Trans. on Components, Hybrids and Manufacturing Tech., vol. CHMT-8, No. 2, Jun. 1985.

American Ceramic Society Bulletin, vol. 60 (1981) May, No. 5, Columbus, Ohio, pp. 540-545; "Interfacial Bond Strength in Alumina Ceramics Metallized and Cofired with Tungsten", Otsuka et al.

Proceedings of the 5th Int. Microelectronics Conf. Int. Soc. Hybrid Microelectron, Tokyo, Japan, May 25-27, 1988, pp. 147-152; "Preparation of High Thermal Conductivity AlN Ceramics and Metallization", Yoneda et al.

*Primary Examiner*—Archene Turner
*Attorney, Agent, or Firm*—Finnegan, Henderson, Farabow, Garrett & Dunner, L.L.P.

[57] ABSTRACT

An aluminum nitride substrate where an electroconductive metallized layer is formed on a ceramic substrate comprising a sintered substance of aluminum nitride with a high thermal conductivity for example 200 W/m·K. The sintered substance of aluminum nitride contains a proper amount of a sintering assistance agent component. The density on the surface of an intergranular phase component mainly comprising the sintering assistance agent component is 3 weight % or less. The metallized layer formed on the sintered substance of aluminum nitride defining the density of the intergranular phase component on the surface of the sintered substance has an excellent bonding strength against the sintered substance of aluminum nitride, the bonding strength being nearly stable.

8 Claims, 3 Drawing Sheets

METALLIZED ALUMINUM NITRIDE SUBSTRATE

This application is a continuation of now abandoned application Ser. No. 07/501,095, filed Mar. 29, 1990.

FIELD OF THE INVENTION AND RELATED ART STATEMENT

The present invention relates to a substrate, specifically to an aluminum nitride substrate having a high thermal conductivity on which a metallized layer is formed with a high bonding strength.

Recently, ceramic substrates using a sintered substance of aluminum nitride with a high thermal conductivity have come to public attention as circuit substrates for hybrid IC devices and so forth.

When a ceramic sintered substance is used as a circuit substrate, it is necessary to form an electroconductive layer thereon. Thus far, an electroconductive layer has been formed on the surface of a ceramics substrate using a sintered substance of aluminum nitride in the following manner.

As a metal component, a high melting point metal such as molybdenum and tungsten is used. The high melting point metal is mixed with various additive powers to make a paste. The paste is coated on the surface of a ceramic substrate to form a desired circuit pattern by using the print method and the like. After that, the substrate where the paste has been coated is sintered to form a metallized layer. An Ni plating layer and Au plating layer are successively formed on the metallized layer to make a circuit substrate.

With the method for forming a metallized layer using the paste containing a high melting point metal such as molybdenum and tungsten, for aluminum nitride substrates whose thermal conductivity is 200 W/m·K or less, a metallized layer with a high bonding strength can be formed. Thus, it can be said that this method is effective in such a condition. On the surface of the sintered substance of aluminum nitride whose thermal conductivity is low, there are relatively a large number of particles of aluminum nitride. Thus, the components of the metallizing paste tend to directly react to the aluminum nitride. In addition, when sintering the metallized layer, since its temperature rises to the sintering temperature of the sintered substance of aluminum nitride, the sintering assistance component in the sintered substance of the aluminum nitride soaks to the surface of the substrate. Since this soaking occurs after the aluminum nitride reacts to the metallizing paste, the intergranular phase component consisting of a compound of the sintering assistance agent which soaks to the surface of the sintered surface permeates in the metallized layer and fills in the gap of the metallized layer and thereby the intergranular phase component contributes to improve the bonding strength.

However, when the above metallizing method using the metallizing paste described above for an aluminum nitride whose thermal conductivity is more than 200 W/m·K, the bonding strength of the metallized layer is generally low and the average strength becomes unstable. Thus, when a substrate where a metallized layer is formed on an aluminum nitride substrate is used, for example, as a substrate which mounts electronic devices whose heating value is high, the bonding surface between the aluminum nitride substrate and the metallized layer is partially peeled off depending on the temperature change.

OBJECT AND SUMMARY OF THE INVENTION

An object of the present invention is to provide an aluminum nitride substrate forming a metallized layer with equal and enough bonding strength on a sintered substrate of aluminum nitride with a high thermal conductivity, for example, which exceeds 200 W/m·K.

In other words, the metallized aluminum nitride substrate according to the present invention comprises a sintered substance of aluminum nitride containing a proper amount of a sintering assistance component, the metallized aluminum nitride substrate further comprising a ceramic substrate where the concentration of the intergranular phase component on the surface thereof is 3 weight % or less and a metallized layer provided on the ceramics substrate.

The sintered substance of aluminum nitride used in the present invention is made by adding, for example, a proper amount of sintering assistance agent to aluminum nitride powder and by finely sintering them by the liquid phase formed by the sintering assistance agent.

As sintering assistance agents to be used, rare earth metals such as yttrium, alkaline rare earth metals such as calcium, oxides such as aluminum, carbonate which becomes such an oxide by heating, and other salts have been known. One of them or a mixture thereof is actually used. The amount of adding a sintering assistance agent to aluminum nitride normally ranges from 1 to 5 weight %.

The sintered substance of aluminum nitride used in the present invention does not specifically have a limit with respect to the thermal conductivity. However, when using a sintered substance of high purity aluminum nitride with a thermal conductivity which exceeds 200 W/m·K, a good effect is obtained.

The thermal conductivity of the sintered substance of aluminum nitride remarkably depends on the amount of impurity therein. Thus, to obtain a sintered substance of aluminum nitride with a high thermal conductivity, it is necessary to keep the amount of impurity low. As such highly purifying method, a sintering process of aluminum nitride powder is conducted in inert gas whose partial pressure of oxygen is low and the oxygen as impurity is removed along with a sintering assistance component.

However, when the sintered substance of aluminum nitride is highly purified in the method described above, a sintering assistance component which traps oxygen, namely, an intergranular phase component is soaked out near the surface thereof, the concentration of the intergranular phase component becoming larger than the inside. Thus, we found the following results through our experiments. On the surface of the sintered substance, the ratio of the intergranular phase component to the aluminum particles increases and thereby the bonding strength of the metallized layer and the aluminum nitride decreases and becomes unstable.

To prevent that, the present invention defines the concentration of the intergranular phase component on the surface of the sintered substance of aluminum nitride as 3 weight % or less. The reasons why the concentration of the intergranular phase component is defined as described above are as follows.

When the concentration of the intergranular phase component on the surface of the sintered substance of aluminum nitride exceeds 3 weight %, the following problems occur.

The aluminum nitride finely sintered by a sintering assistance agent has so called an intergranular phase mainly comprising a sintering assistance component among the aluminum nitride particles. This intergranular phase component is a compound of YAG, YAM, YAL, and the like which are produced by chemical reactions of $Y_2O_3$, TiN, $Al_2O_3$, and the like. When the sintered substance of aluminum nitride is finely purified, the intergranular component is soaked out near the surface of the sintered substance and thereby the concentration of the intergranular phase component on the surface of the sintered substance remarkably becomes larger than that of the inside thereof.

The intergranular phase component does not directly react to the component which contributes to the bonding of the metallizing paste, thereby disturbing the formation of the metallized layer. In addition, since the intergranular phase component is unstably present on the surface of the sintered substance of aluminum nitride, the metallized layer formed thereon tends to be peeled off by heat cyclically applied. The portion where the intergranular phase component prevents the aluminum nitride from reacting to the metallized layer is formed in the manner that the surface layer of high concentration intergranular phase component which is not bondable both to the sintered substance of aluminum nitride and the metallized layer is sandwiched therebetween.

Thus, if much intergranular phase component mainly comprising such a sintering assistance agent is present on the surface of the sintered substance, the bonding strength of the metallized layer becomes unstable and thereby a metallized substrate cannot be produced in high quality.

On the other hand, when the concentration of the intergranular phase component on the surface of the sintered substance of aluminum nitride is kept to 3 weight % or less, the reacting area in which the aluminum nitride particles react to the metallizing paste is obtained and thereby a metallized layer which is securely and stably bonded to the sintered substance of aluminum nitride is obtained.

The preferred concentration of the intergranular phase component on the surface of the sintered substance of aluminum nitride is 1 weight % or less.

The concentration of the intergranular phase component on the surface of the sintered substance of aluminum nitride according to the present invention is obtained by irradiating X ray on the surface of the sintered substance of aluminum nitride, measuring the peak value, and determining it on the working curve. The concentration of the surface portion refers to the concentration on the surface of the sintered substance of aluminum nitride unless otherwise noted. However, it may represent the concentration of the sintered substance layer whose thickness is approximately 50 μm including the uppermost surface.

As a method for forming the surface of the sintered substance of aluminum nitride, the following method may be exemplified. For example, firstly, a sintered substance of aluminum nitride is made. Before a metallizing paste is coated on the sintered substance of aluminum nitride, by using a conventional grinding method such as lapping and honing, the surface of the sintered substance is ground. In this grinding process, the surface layer where the density of the intergranular phase component is high is removed along with impurity such as parting agent which stays on the sintered substance.

The grinding amount in the above grinding process is determined by considering the amount of adding the sintering assistance agent, the sintering method, and so forth. When the grinding amount is small, even if the physical smoothness of the surface of the sintered substance can be obtained, the surface layer whose component is unstable cannot be completely removed. Namely, the intergranular phase component which is partially present prevents the aluminum nitride from directly reacting to the metallizing paste. Thus, when heat is cyclically applied, the bonding strength of the metallized layer is degraded.

Generally, the preferred grinding amount is 10 μm or more in the depth direction of the sintered substance. When the grinding amount is 10 μm or less, although the parting agent which is used in the sintering process can be removed, the surface layer where the density of the intergranular phase component is high cannot be completely removed and thereby the effect of the present invention cannot be obtained.

The preferred concentration distribution in the depth direction of the intergranular phase component of the sintered substance of aluminum nitride used in the present invention is within the surface density ±1.5 weight %.

If the concentration distribution of the intergranular phase component remarkably changes in the depth direction thereof, when the metallizing paste is sintered, the amount of the intergranular phase component which is soaked to the surface becomes unstable, thereby preventing the bonding strength from being improved. In other words, when the concentration distribution of the intergranular phase component is stable against the concentration on the surface of the sintered substance, such as ±1.5 weight %, it is possible to accelerate the permeation of the intergranular phase component to the metallized layer. The permeation of the intergranular phase component to the metallized layer causes the gap in the metallized layer to be filled, thereby improving the bonding strength of the metallized layer. The permeation of the intergranular phase component to the metallized layer takes place after the metallizing paste reacts to the aluminum nitride. Thus, the reaction is not disturbed.

The metallized aluminum substrate according to the present invention can be obtained, for example, by forming a metallized layer on the surface of the sintered substance of aluminum nitride whose concentration of the intergranular phase component is 3 weight % or less through a conventional grinding process that follows.

For example, a metallizing compound containing a compound of active metal such as Ti as an additive is mixed with a metal with a high melting point such as molybdenum and tungsten along with an organic binder and if necessary a dispersion medium to produce a metallizing paste with a predetermined viscosity. After that, this paste is coated on the surface of the sintered substance of aluminum nitride where the concentration of the intergranular phase component is 3 weight % or less in a desired pattern using the print method and the like. Then, it is dried and sintered in inert gas such as nitrogen gas to form the metallized layer.

As described above, in the metallized aluminum nitride substrate of the present invention, since the concentration of the intergranular phase component in the sintered substance of aluminum nitride is 3% weight %, the intergranular phase component in the sintered substance of aluminum nitride dissociating the bonding to the metallized layer and serving as an obstruction factor for forming the metallized layer, the reaction area between the aluminum nitride substrate and the metallizing paste increases, thereby forming a metallized layer with a high bonding strength. Thus, for sintered substance of aluminum nitride whose thermal conductivity is 200 W/m·K or more, a metallized layer with a high bonding strength can be formed.

When the metallized aluminum nitride is used as a circuit substrate and the like, normally an Ni plating layer and an Au plating layer are formed in the order thereon.

The preferred Ni plating layer comprises at least the Ni electroplating layer and NI—B nonelectrolytic plating layer. Such an Ni plating layer can be practically categorized as follows.

(1) Only Ni electroplating layer
(2) Only Ni—B nonelectrolytic plating layer (3) Laminate of Ni electroplating layer and Ni—B nonelectrolytic plating layer In the above types, it is preferred to place an Ni—B nonelectrolytic plating layer, whose production cost is low, on the metallized layer for the thickness necessary for the function of an Ni electroplating layer and then to place the Ni electroplating layer, which has an excellent bonding property, for the minimum thickness. The thickness necessary for the Ni plating layer is, for example, in the range from 3 µm to 5 µm, where the preferred thickness of the Ni—B nonelectrolytic plating layer is approximately 30% thereof.

By using such an Ni electroplating layer, after semiconductor devices and the like are mounted on the Au plating layer with Au—Si solder or Au—Ge solder, the bonding strength between the Ni plating layer and the Au plating layer does not decrease. Thus, it is possible to provide a variety of electronic devices with a high reliability.

DETAILED DESCRIPTION OF PREFERRED EMBODIMENTS

Embodiments of the present invention will be descried in the following.

Embodiment 1

FIGS. 1a–1d show a production process of a metallized aluminum nitride substrate according to the present invention.

In FIGS. 1a–1d, 1 is a sintered substance of aluminum nitride where 3 weight % of $Y_2O_3$ is added to aluminum nitride powder as a sintering assistance agent and which is made using the normal pressure sintering method. The thermal conductivity of the sintered substance of aluminum nitride is 200 W/m·K.

On the uppermost surface of the sintered substance of aluminum nitride 1 which has been sintered, a parting agent 2 which has been used in the sintering process is present. Moreover, on the surface of the sintered substance of aluminum nitride 1, an intergranular phase component mainly comprising a compound of a sintering assistance agent is soaked out of the inside of the sintered substance of aluminum nitride 1 and thereby a surface layer 3 where the concentration of the intergranular phase component is high is present (see FIG. 1a).

The surface of the sintered substance of aluminum nitride 1 is ground as follows.

Figure 1A:
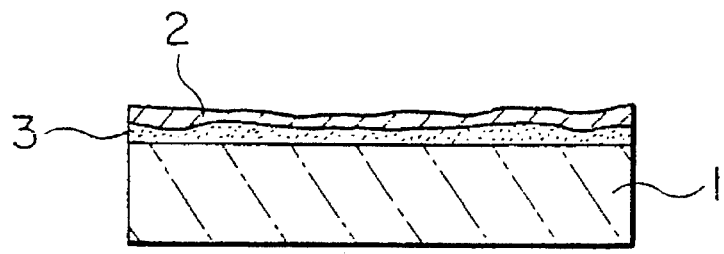
FIGS. 1a–1d are views of a production process of a metallized aluminum nitride substrate of an embodiment according to the present invention.
Figure 1B:
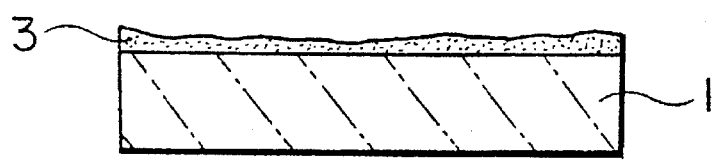
Figure 1C:
Figure 1D:
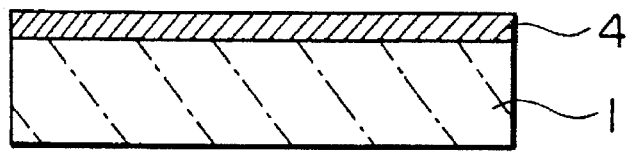

The outermost layer of the sintered substance of aluminum nitride 1 is ground using the honing method to remove the parting agent 2 (see FIG. 1b). By grinding the surface for 40 µm in the depth direction, the surface layer 3 of the sintered substance is removed (see FIG. 1c).

The concentration of the intergranular phase component on the surface of the sintered substance of aluminum nitride 1 where such a grinding process has been conducted is 1.4 weight %. The concentration distribution of the intergranular phase component in the depth direction of the sintered substance of aluminum nitride 1 is 0.4 weight %.

After that, on the sintered substance of aluminum nitride 1 where the surface layer 3 has been removed, an Mo—TiN paste as a metallizing paste is coated. Then, they are sintered in nitrogen gas at 1700° C. and a metallized layer 4 is formed (see FIG. 1d).

By using an aluminum nitride substrate 5 in the above manner, the bonding strength of the metallized layer 4 is measured.

The bonding strength of the metallized layer 4 is evaluated in the following method.

A 60 mm×60 mm aluminum nitride substrate 5 is cut in 2.5 mm×2.5 pieces for test samples. For the 50 pieces of test samples, an Ni plating layer is formed on the metallized layer 4.

A copper lead wire is soldered on the Ni plating layer. The copper lead wire is pulled in the vertical direction and the bonding strength is evaluated using the force with which the copper lead wire is peeled off. This bonding strength is also evaluated after a thermal cycle test (TCT) is conducted so as to evaluate the reliability in cold heat cycles.

On the 50 pieces of metallized aluminum nitride obtained in the embodiment, a transistor is mounted and the heat resistance is measured using the $V_{BE}$ method.

In the results obtained in the above tests, the standard deviations are also obtained. Table 1 shows the results of such tests.

When the surface of the sintered substance of aluminum nitride made in the embodiment 1 is gradually ground and the X ray diffraction is conducted so as to measure the X ray diffraction strength of the surface of the sintered substance in various depth values, the following results are obtained.

Figure 2:
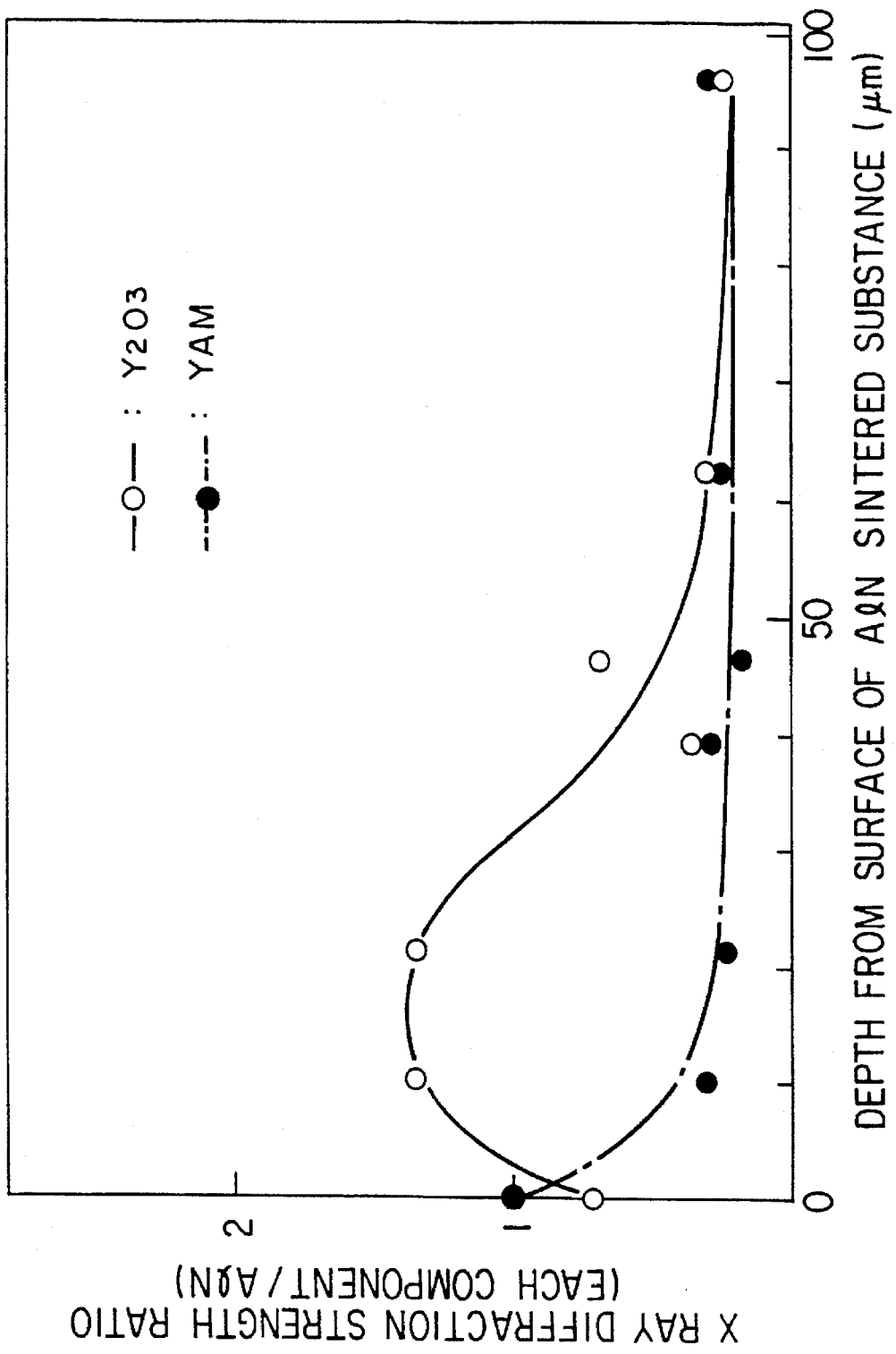
FIG. 2 is a chart showing in diffraction strength ratio the X ray diffraction results of individual materials in the depth direction of the sintered substance of aluminum nitride produced in accordance with the embodiment of the present embodiment.

FIG. 2 shows the results obtained from the X ray diffraction using diffraction strength ratio of AlN of the sintered substance of aluminum nitride and $Y_2O_3$ and YAM ($2Y_2O_3 \cdot Al_2O_3$) which are intergranular phase component of the sintered substance of aluminum nitride. The surface coefficients of the individual phase components are: AlN/(200), $Y_2O_3$/(222), and YAM/(023). The white circles and the black circles in the figure represent the diffraction strength ratio of $Y_2O_3$ to ALN and that of YAM to AlN, respectively.

FIG. 2 shows that the distribution of the intergranular phase component of the sintered substance of aluminum nitride changes in the depth direction of the sintered substance. Particularly, nearly on the surface, the figure shows that the concentration of the intergranular phase component is high.

Figure 3:
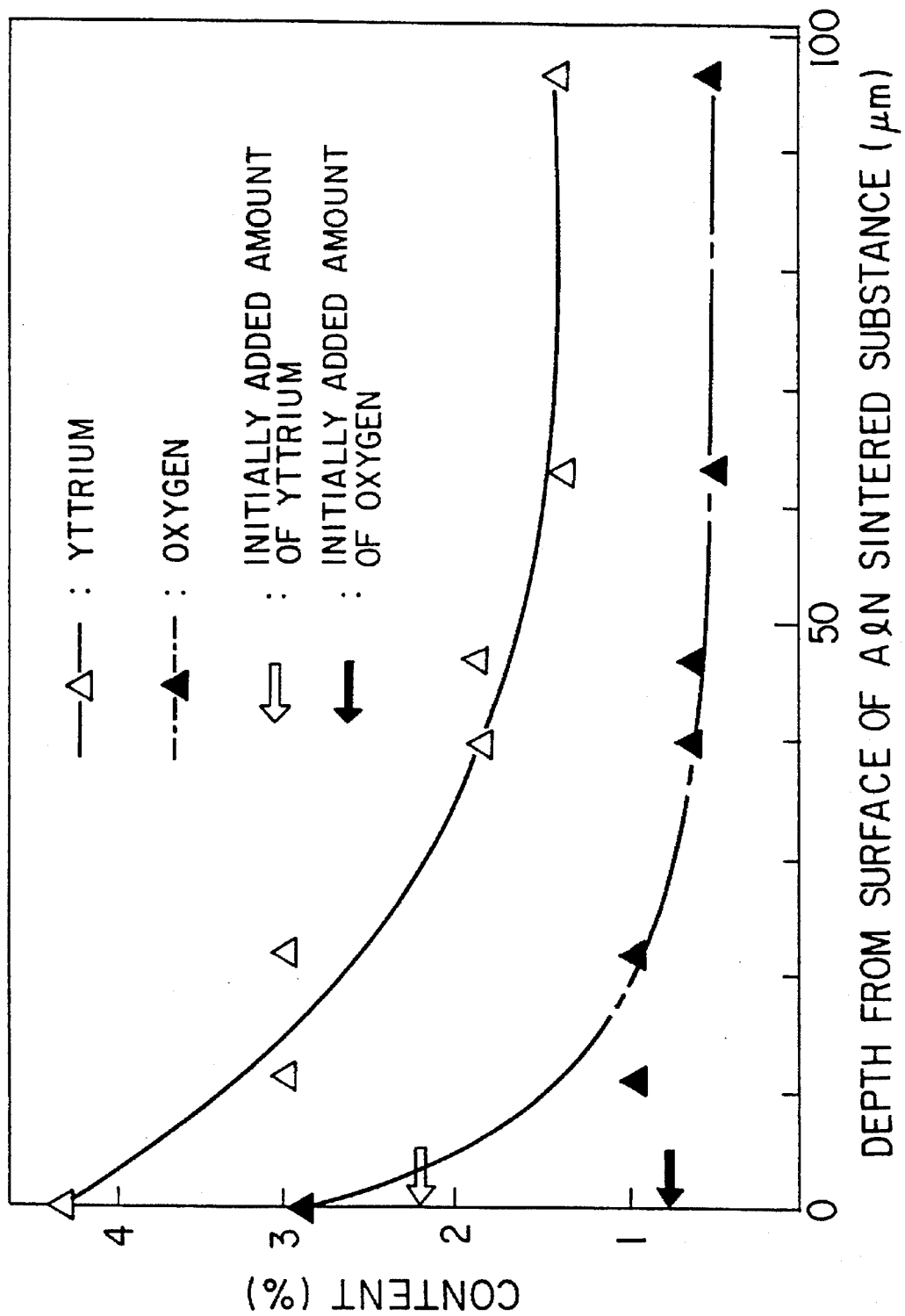
FIG. 3 is a chart quantitatively showing the results of FIG. 2.

FIG. 3 shows quantified values of X ray diffraction strength ratio of FIG. 1. It shows that the contents of yttrium and oxygen of the sintered substance of aluminum nitride changes in the depth direction. In the figure, the white triangles and black triangles represent the content of yttrium and that of oxygen, respectively. In addition, the figure shows their initially added amounts with arrow marks.

FIG. 3 shows that the content of the intergranular phase component 30 µm below the surface is larger than the initially added amount. It represents that the intergranular phase component of the sintered substance of aluminum nitride is soaked to the surface.

Embodiment 2

Like the sintered substance of aluminum nitride used in the embodiment 1, a sintered substance which contains $Y_2O_3$ as a sintering assistance agent, whose thermal conductivity is 200 W/m·K and where the grinding amount of the surface is 15 μm is used. In the same condition as the embodiment 1, a metallized layer is formed and a metallized aluminum nitride substrate is obtained.

The concentration of the intergranular phase component on the surface of the sintered substance of aluminum nitride is 2.8 weight % and the concentration distribution of the intergranular phase component in the depth direction is 1.3 weight %.

For the metallized aluminum nitride made in this embodiment, the bonding strength and heat resistance have been measured and the results are shown in Table 1.

Comparison 1

Like the sintered substance of aluminum nitride used in the embodiment 1, a sintered substance which contains $Y_2O_3$ as a sintering assistance agent, whose thermal conductivity is 200 W/m·K and where the grinding amount of the surface is 5 μm is used.

After the surface of the sintered substance of aluminum nitride is ground, the concentration of the intergranular phase component is 3.3 weight %. The concentration distribution of the intergranular phase component in the depth direction thereof is 1.9 weight %.

After that, a metallized layer is formed on the ground surface of the sintered substance of aluminum nitride in the same condition as the embodiment 1 and the metallized aluminum nitride substrate is obtained.

For the aluminum nitride substrate made in the comparison 1, the bonding strength and heat resistance of the metallized layer have been measured in the same condition as the embodiment 1. The results are also shown in Table 1.

Comparison 2

A sintered substance which is the same as the sintered substance of aluminum nitride used in the embodiment 1, except that the sintered substance contains $Y_2O_3$ as a sintering assistance agent and the thermal conductivity is 200 W/m·K, is used without grinding the surface thereof.

The concentration of the intergranular phase component on the surface of the sintered substance of aluminum nitride is 4.3 weight %. The concentration distribution of the sintered substance of aluminum nitride in the depth direction thereof is 2.9 weight %.

For the sintered substance of aluminum nitride, a metallized layer is formed in the same condition as the embodiment 1 and a metallized aluminum nitride is obtained.

For the aluminum nitride substrate made in this comparison, the bonding strength and the heat resistance of the metallized layer have been measured in the same condition as the embodiment 1. The results are shown in Table 1.

TABLE 1

|  | Embodiment | | Comparison | |
|---|---|---|---|---|
|  | 1 | 2 | 1 | 2 |
| Concentration of intergranular phase on surface (weight %) | 1.4 | 2.8 | 3.3 | 4.3 |
| Density distribution of intergranular phase in depth direction (weight %) | 0.4 | 1.3 | 1.9 | 2.9 |
| Grinding amount (μm) | 40 | 15 | 5 | 0 |
| Bonding strength before conducting TCT (kg) | 18.0 | 18.2 | 16.5 | 15.3 |
| (Standard deviation) | (25.3) | (2.32) | (3.86) | (4.32) |
| Bonding strength after conducting TCT (kg) | 17.8 | 18.3 | 15.2 | 14.0 |
| (Standard deviation) | (2.45) | (2.40) | (4.02) | (4.55) |
| Heat resistance (°C./W) | 3.62 | 3.68 | 3.66 | 3.78 |
| (Standard deviation) | (3.70) | (3.67) | (4.80) | (5.20) |

As obviously described in Table 1, when the concentration of the intergranular phase on the surface of the sintered substance of aluminum nitride is defined as 3 weight %, for the aluminum nitride substrate where a metallized layer is formed according to each embodiment, the bonding strength of the metallized layer is large and nearly constant. The results are also applicable to those after TCT is conducted. Thus, the reliability against heat being applied is high.

Embodiment 3

Another embodiment of the present invention will be described in the following.

In the embodiment 3, three types of sintered substances of aluminum nitride containing $Y_2O_3$ as a sintering assistance agent and whose thermal conductivities are 130 W/m·K, 200 W/m·K, and 260 W/m·K are used.

In this embodiment, the three types of sintered substances of aluminum nitride whose thermal conductivitys are 130, 200, and 260 W/m·K are used. The grinding amount of each sintered substance is changed and a metallized layer is formed on each sintered substance of aluminum nitride which has been ground. By changing the grinding amount of each sintered substance, a metallized layer is formed on the sintered substance and the bonding strength of the metallized layer is measured.

For metallized aluminum nitride substrates made using sintered substances of aluminum nitride whose thermal conductivitys are 130 and 200 W/m·K, their heat resistances where a transistor is mounted are measured. The bonding strength and the heat resistance of the metallized aluminum nitride substrates made in the above manner have been measured in the same condition as the embodiment 1.

Tables 2 and 3 show the bonding strength and the heat resistance of the metallized layer of each substrate being made.

TABLE 2

| Grinding amount (μm) | | Bonding strength (kg) | | |
|---|---|---|---|---|
|  |  | 130 W/m · K | 200 W/m · K | 260 W/m · K |
| 0 | Before TCT | 14.1 | 12.4 | 3.8 |
|  | After TCT | 12.1 | 9.2 | 2.5 |
| 30 | Before TCT | 16.3 | 15.9 | 13.7 |
|  | After TCT | 12.3 | 13.0 | 11.3 |
| 100 | Before TCT | 16.8 | 18.0 | 16.0 |
|  | After TCT | 14.5 | 17.5 | 14.9 |

TABLE 3

| Grinding amount (μm) | | Heat resistance (°C./W) | |
| --- | --- | --- | --- |
| | | 130 W/m · K | 200 W/m · K |
| 0 | Before TCT | 4.25 | 3.78 |
| | After TCT | 4.29 | 4.56 |
| 100 | Before TCT | 4.21 | 3.80 |
| | After TCT | 4.30 | 3.82 |

As described above, in metallizing a sintered substance of aluminum nitride with a high thermal conductivity, by processing the surface thereof with grinding means and the like and setting the concentration of the intergranular phase component to a particular value, the reaction environment of the aluminum nitride and the metallizing paste is improved and thereby a metallized layer with a high bonding strength can be formed.

In addition, by using a sintered substance of aluminum nitride where the concentration distribution of the intergranular phase component in the depth direction is ±1.5 weight %, the permeation of the intergranular phase component to the metallized layer is furthered and the bonding strength of the metallized layer can be improved.

Consequently, when the metallized aluminum nitride substrate made using a sintered substance of aluminum nitride whose thermal conductivity is 200 W/m·K is used as, for example, a heat sink for a radio frequency semiconductor device, the enough reliability can be obtained.

What is claimed is:

1. A metallized aluminum nitride substrate, comprising:
   a sintered aluminum nitride substrate comprising a primary phase consisting essentially of aluminum nitride and an intergranular phase consisting essentially of a sintering assistance agent, a concentration of said intergranular phase component on a surface of said sintered aluminum nitride substrate being 3 weight % or less, and
   a metallized layer disposed directly on said surface of said sintered aluminum nitride substrate.

2. The metallized aluminum nitride substrate according to claim 1, wherein a concentration distribution of the intergranular phase component in a depth direction of said sintered aluminum nitride substrate is ±1.5 weight % or less.

3. The metallized aluminum nitride substrate according to claim 1, wherein the thermal conductivity of said sintered aluminum nitride substrate is 200 W/m·K or more.

4. The metallized aluminum nitride substrate according to claim 2, wherein the thermal conductivity of said sintered aluminum nitride substrate is 200 W/m·K or more.

5. The metallized aluminum nitride substrate according to claim 1, wherein said sintering assistance agent is at least one compound selected from the group consisting of rare earth metal compounds, alkaline earth metal compounds, and an aluminum oxide.

6. The metallized aluminum nitride substrate according to claim 2, wherein said sintering assistance agent is at least one compound selected from the group consisting of rare earth metal compounds, alkaline earth metal compounds, and an aluminum oxide.

7. The metallized aluminum nitride substrate accordance to claim 1, wherein said intergranular phase component on the surface of said sintered aluminum nitride substrate is from said sintered aluminum nitride substrate.

8. A metallized aluminum nitride substrate, comprising:
   a sintered aluminum nitride substrate having a thermal conductivity of at least 200 W/m·K comprising a primary phase consisting essentially of aluminum nitride and an intergranular phase consisting essentially of a sintering assistance agent, a concentration of said intergranular phase component on a surface of said sintered aluminum nitride substrate being 3 weight % or less, and
   a metallized layer disposed directly on said surface of said sintered aluminum nitride substrate.

* * * * *